United States Patent
Bayramian et al.

(10) Patent No.: US 6,640,040 B2
(45) Date of Patent: Oct. 28, 2003

(54) COMPACT CLADDING-PUMPED PLANAR WAVEGUIDE AMPLIFIER AND FABRICATION METHOD

(75) Inventors: Andy J. Bayramian, Manteca, CA (US); Raymond J. Beach, Livermore, CA (US); Eric Honea, Seattle, WA (US); James E. Murray, Livermore, CA (US); Stephen A. Payne, Castro Valley, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 10/098,264

(22) Filed: Mar. 15, 2002

(65) Prior Publication Data

US 2002/0131746 A1 Sep. 19, 2002

Related U.S. Application Data

(60) Provisional application No. 60/276,812, filed on Mar. 15, 2001.

(51) Int. Cl.[7] ............................. G02B 6/10; H01L 21/00
(52) U.S. Cl. ................... 385/131; 359/341.1; 359/345; 438/22; 438/31; 385/129; 385/126
(58) Field of Search ............................. 385/129–132, 385/27, 126; 359/342, 345, 341.1; 372/70; 438/22, 31

(56) References Cited

U.S. PATENT DOCUMENTS

| | | | |
|---|---|---|---|
| 5,841,928 A | * | 11/1998 | Maxwell et al. ............ 385/129 |
| H1848 H | * | 5/2000 | Amin et al. ................ 385/132 |
| 6,270,604 B1 | * | 8/2001 | McCallion et al. .......... 156/99 |
| 6,288,833 B1 | * | 9/2001 | Kasamatsu .................. 359/333 |
| 6,330,388 B1 | | 12/2001 | Bendett et al. .............. 385/132 |
| 6,370,297 B1 | * | 4/2002 | Hakimi et al. ................ 385/27 |
| 6,462,864 B1 | * | 10/2002 | Lange et al. ............. 359/341.1 |
| 2001/0041040 A1 | * | 11/2001 | McCallion et al. ......... 385/129 |

OTHER PUBLICATIONS

Jason Gwo, An Ultra–Precision and Reliable Bonding Technique Using Hydroxide–Catalyzed Surface Hydration/Dehydration, Standford University Office of Technology Licensing Feb. 26, 1997 (Rev. 3) pp. 3–7.

\* cited by examiner

Primary Examiner—Brian Healy
Assistant Examiner—Daniel Petkovsek
(74) Attorney, Agent, or Firm—James S. Tak; Alan H. Thompson

(57) ABSTRACT

A low-cost, high performance cladding-pumped planar waveguide amplifier and fabrication method, for deployment in metro and access networks. The waveguide amplifier has a compact monolithic slab architecture preferably formed by first sandwich bonding an erbium-doped core glass slab between two cladding glass slabs to form a multi-layer planar construction, and then slicing the construction into multiple unit constructions. Using lithographic techniques, a silver stripe is deposited and formed at a top or bottom surface of each unit construction and over a cross section of the bonds. By heating the unit construction in an oven and applying an electric field, the silver stripe is then ion diffused to increase the refractive indices of the core and cladding regions, with the diffusion region of the core forming a single mode waveguide, and the silver diffusion cladding region forming a second larger waveguide amenable to cladding pumping with broad area diodes.

55 Claims, 9 Drawing Sheets

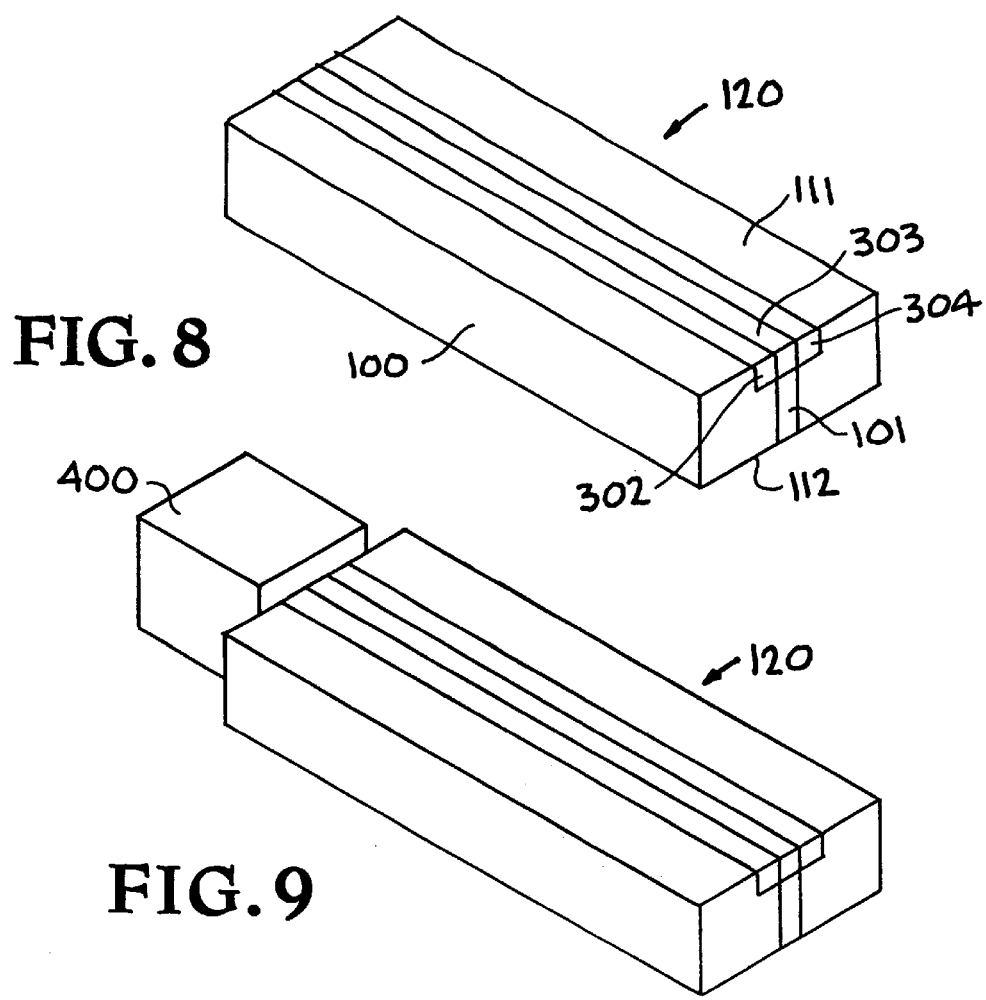
FIG. 8
FIG. 9
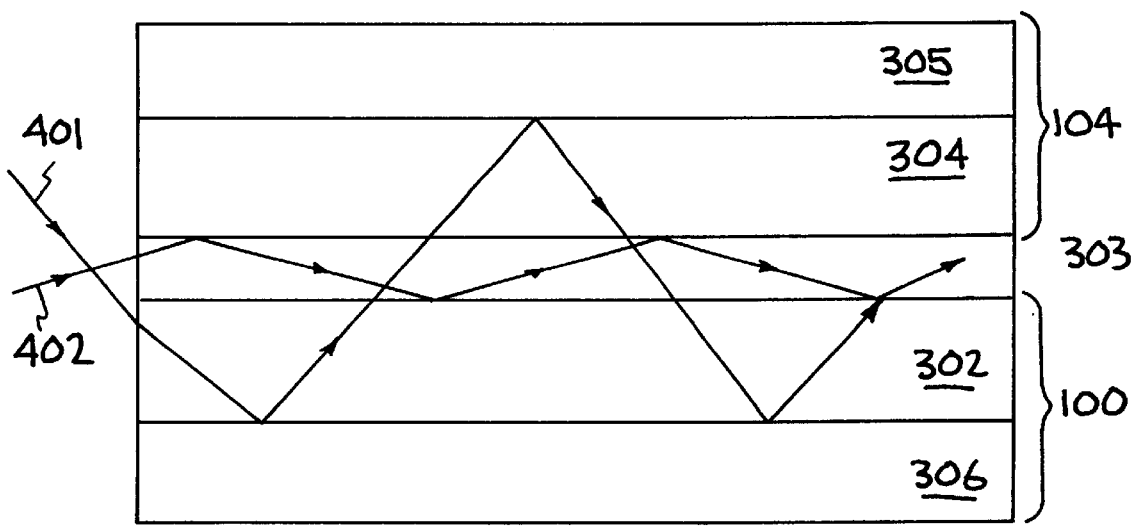
FIG. 10

COMPACT CLADDING-PUMPED PLANAR WAVEGUIDE AMPLIFIER AND FABRICATION METHOD

The present invention relates to and claims priority under 35 USC 120 to Provisional Application No. 60/276,812 filed Mar. 15, 2001, entitled "Erbium Doped Waveguide Amplifier and Method Thereof".

The United States Government has rights in this invention pursuant to Contract No. W-7405-ENG-46 between the United States Department of Energy and the University of California for the operation of Lawrence Livermore National Laboratory.

FIELD OF THE INVENTION

The present invention relates to optical amplifiers in communications networks. The present invention relates more particularly to a low-cost, compact, high performance rare earth-doped planar waveguide amplifier for use in metropolitan area networks, and a method for fabricating the same.

BACKGROUND OF THE INVENTION

Over a decade ago, optical amplifiers were developed to replace electronic repeaters in the telecommunications network due to the high cost of building and operating electronic repeaters, as well as the introduction of bottlenecks caused by electronic regeneration. Optical amplifiers enable "optical transparency," allowing the data stream to travel thousands of miles without encountering the need for electrical regeneration. In particular, long-haul transmission designers started to embrace communications at a wavelength of 1.55 μm using erbium (Er) doped silica glass fiber amplifiers (EDFAs), leading to the massive build-up of the present day communications network infrastructure. The substantial gain bandwidth of the EDFA, together with the use of wavelength division multiplexing (WDM) to combine and separate signals, has enabled transmission of 160 individual wavelengths in the fiber, with the bit rate for each wavelength channel usually 2.5 Gb/s, and continuing to increase (to 10 and even 40 Gb/s).

Since the introduction of optical amplifiers, the telecommunications infrastructure and market have grown explosively due to the burgeoning demand for communications and information. In particular, the increased demand has led to the growth in infrastructure of "metropolitan area networks" (MANs or simply metro) where broad bandwidth is brought closer to and made directly accessible by consumers. FIG. 1 illustrates the core relationship of MANs 11 with access networks, such as broadband cable TV. While the direct optical amplification with EDFAs (13 in FIG. 1) has been successful in meeting the need for raw bandwidth in the long-haul portion (12 in FIG. 1) of the network, it is considered too expensive for widespread use in MANs, and very bulky with fiber lengths of about 40 m.

Thus, in order to address the increased need for raw bandwidth for metro and consumer access to broadband, metro networks require a compact, reliable, high-performance 1.55 μm optical amplifier capable of low cost commercial mass production. Such an optical amplifier would enable new functionality (i.e. cost, integration, and/or alternative hosts) for the metro and access networks. It is expected that the transmission rates per wavelength will continue to increase from 2.5 Gb/s to 40 Gb/s. Without low cost amplifiers widely implemented throughout the metro and access networks, the higher transmission rates will reduce the reach of the transmitters, limiting the ability to upgrade the system.

SUMMARY OF THE INVENTION

One aspect of the present invention includes a method of fabricating a monolithic cladding-pumped optical waveguide amplifier, comprising the steps of: fabricating a multi-layer planar construction having n rare earth-doped core layer(s) and n+1 cladding layers in alternating layered arrangement, and top and bottom surfaces revealing a cross-section of the layers, wherein the core layer(s) has a higher refractive index than the cladding layers; and diffusing ions through at least one of the top and bottom surfaces into the core layer(s) and the cladding layers to form ion-diffused regions thereof having respectively increased refractive indices, the ion-diffused regions forming an ion-diffused block laterally situated between non-diffused regions of a pair of partially-diffused cladding layers. In this manner, the ion-diffused region(s) of the core layer(s) forms a signal waveguide(s) for carrying signals therethrough, and the ion-diffused regions of the cladding slabs together form a cladding-pump waveguide for optically pumping the signals carried through the signal waveguide(s).

Another aspect of the present invention includes a method of fabricating a monolithic cladding-pumped optical waveguide amplifier, comprising the steps of: bonding n core slab(s) with n+1 cladding slabs in alternating layered arrangement to produce a multi-layer planar construction, wherein the core slab(s) has a refractive index greater than the cladding slabs; slicing the multi-layer planar construction into at least two multi-layer planar units each having top and bottom surfaces revealing a cross-section of the slab bonding; on each multi-layer planar unit, producing by metal deposition and photolithography an ion-diffusable metallic stripe on one of the top and bottom surfaces and over the core slab(s) and the cladding slabs; and diffusing ions from the metallic stripe into the core slab(s) and the cladding slabs to form ion-diffused regions of the core slab(s) and the cladding slabs having respectively increased refractive indices, the ion-diffused regions forming an ion-diffused block laterally situated between non-diffused regions of a pair of partially-diffused cladding slabs. In this manner, the ion-diffused region of the core slab forms a signal waveguide for carrying signals therethrough, and the ion-diffused regions of the cladding slabs together form a cladding-pump waveguide for optically pumping the signals carried through the signal waveguide.

Another aspect of the present invention is a method of fabricating a monolithic cladding-pumped optical waveguide amplifier from a multi-layer planar substrate, said multi-layer planar substrate having n rare earth-doped core layer(s) and n+1 cladding layers in alternating layer arrangement, and top and bottom surfaces revealing a cross-section of the layers, wherein the core layer(s) has a higher refractive index than the cladding layers, said method comprising the steps of: diffusing ions through at least one of the top and bottom surfaces into the core layer(s) and the cladding layers to form ion-diffused regions thereof having respectively increased refractive indices, the ion-diffused regions forming an ion-diffused block laterally situated between non-diffused regions of a pair of partially-diffused cladding layers, wherein the ion-diffused region(s) of the core layer(s) forms a signal waveguide(s) for carrying signals therethrough, and the ion-diffused regions of the cladding slabs together form a cladding-pump waveguide for optically pumping the signals carried through the signal waveguide(s).

Another aspect of the present invention includes a monolithic cladding-pumped optical waveguide amplifier fabricated according to one of the methods described above.

Some of the advantages of the monolithic cladding-pumped optical waveguide amplifier and method of the present inventions include the lowering of manufacturing costs due to the incorporation of standard lithographic techniques that naturally extend to commercial mass production. The compact slab architecture also enables the use of low cost high-power broad stripe diode pumps which can further lower costs. The waveguide amplifier is suitable for use in both single and multimode high-power waveguide amplifiers. Moreover, the compact cladding-pumped slab architecture of the waveguide amplifier offers increased functionality and performance to low and high-power waveguide lasers involving different hosts and laser ions.

BRIEF DESCRIPTION OF THE DRAWINGS

The accompanying drawings, which are incorporated into and form a part of the disclosure, are as follows:

FIG. 8 is a front perspective view of the planar unit waveguide following ion diffusion of FIG. 7B and removal of the aluminum layer and excess silver stripe.

FIG. 9 is a front perspective view of the planar unit waveguide coupled to a diode pump in an illustrative arrangement.

FIG. 10 is a top view of the planar unit waveguide of FIG. 9 illustrating signal and diode light paths for optic pumping.

DETAILED DESCRIPTION

Turning now to the drawings, FIGS. 2–8 show a first preferred fabrication method of the present invention for producing a compact cladding-pumped planar waveguide amplifier. The first preferred embodiment of the present invention combines slab bonding and metal ion diffusion to create a cladding-pumped planar waveguide amplifier, commonly referred to as an EDWA (erbium-doped waveguide amplifier). The process of the present invention utilizes standard lithographic techniques that reduce costs by naturally extending to commercial mass production. Moreover, the multi-layer planar construction produced according to the process of the present invention is configured to optimize the use of inexpensive broad stripe diode pumps to further increase cost savings.

Figure 1:
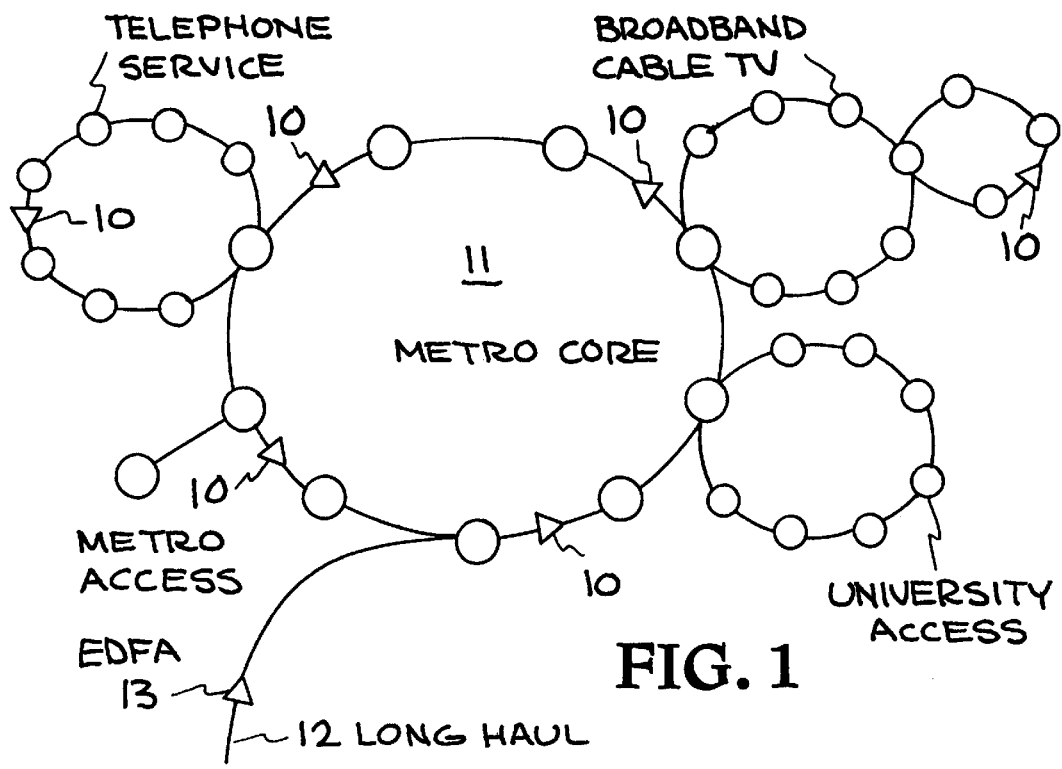
FIG. 1 is an organizational illustration of a metro core and access networks for which the present invention is ideally suited.
Figure 2:
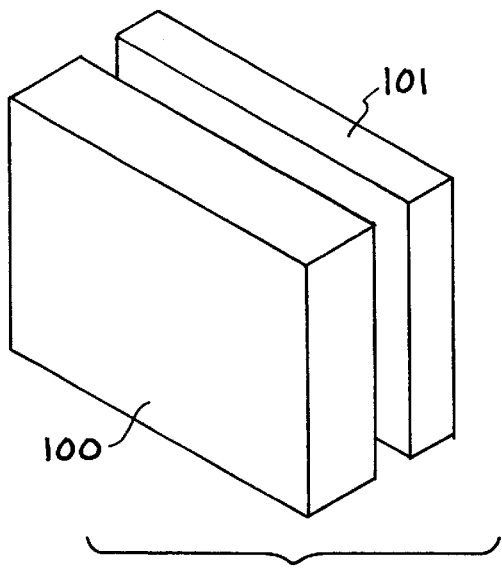
FIG. 2 is a front perspective view of a first cladding slab and a core slab prior to bonding.

FIG. 2 shows a first cladding slab 100 and a core slab 101 both having a generally rectangular shape. The first cladding material 100 (and the second cladding material 104 in FIG. 5) is an undoped glass, while the core slab 101 is a rare earth-doped glass. It is notable that while erbium is a commonly used dopant in communications applications (ergo the common acronym "EDWA") the present invention is not limited only to such. The architecture of the cladding-pumped planar waveguide amplifier could be readily applied to other gain media such as Yb:glass, Nd:glass, Tm:glass, or other rare earth-doped glass with no other variation than simply using a different rare earth as the dopant in an ion exchangeable glass. The glass composition is unimportant other than its ability to undergo ion exchange; any ion exchangeable glass will suffice. Additionally, co-doped media may alternatively be utilized, such as Yb: Er, to reduce the absorption length. In any case, the doping level is sufficient for efficient absorption and high gain. And the refractive index of the core slab 101 is greater than the refractive index of the first cladding slab 100 (as well as the refractive index of the second cladding slab 104) so as to enable waveguiding. It is notable that the respective indices of the first and second cladding slabs 100 and 104 need not be equal, only that they be less than the refractive index of the core slab 101.

Figure 3:
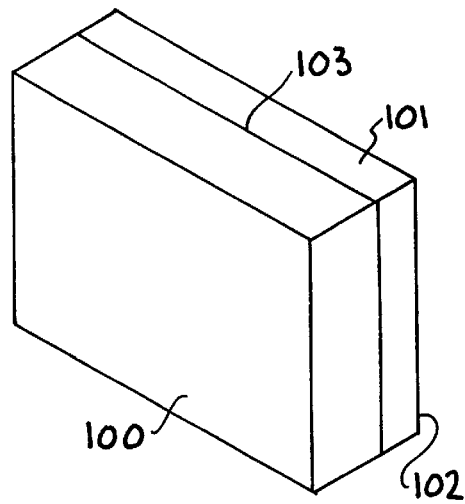
FIG. 3 is a front perspective view following FIG. 2 of the first cladding slab and a core slab after bonding.

FIG. 3 shows the first cladding slab 100 and the core slab 101 bonded together at a first bond 103. Various bonding techniques may be utilized to effect slab bonding. Silica glue based on potassium hydroxide and dissolved silicon dioxide is one preferred method of optically bonding the slabs according to a publication entitled, "An Ultra-Precision and Reliable Bonding Technique Using Hydroxide-Catalyzed Surface Hydration/Dehydration," the disclosure of which is incorporated herein by reference. A combination of pressure and temperature near the diffusion point (approximately 400° C.) cures the glue and anneals out defects. Alternatively, phosphate glue (similar to silica glue) may be utilized in a phosphate glue bonding process provided by Schott Glass Technologies of Duryea, Pa. Still other alternative methods include using an optical epoxy polymer or thermal diffusion bonding to create the optical bond. In the case of thermal diffusion bonding, a bond is formed by optically contacting the surfaces with temperature and pressure. Moreover, the thermal diffusion bond is annealed at a temperature near the thermal diffusion temperature. In any case, the core slab 101 and the cladding slabs 100, 104 are preferably first polished to about λ/20 wave flatness prior to the bonding step to minimize loss at the bonds.

Figures 4, 5:
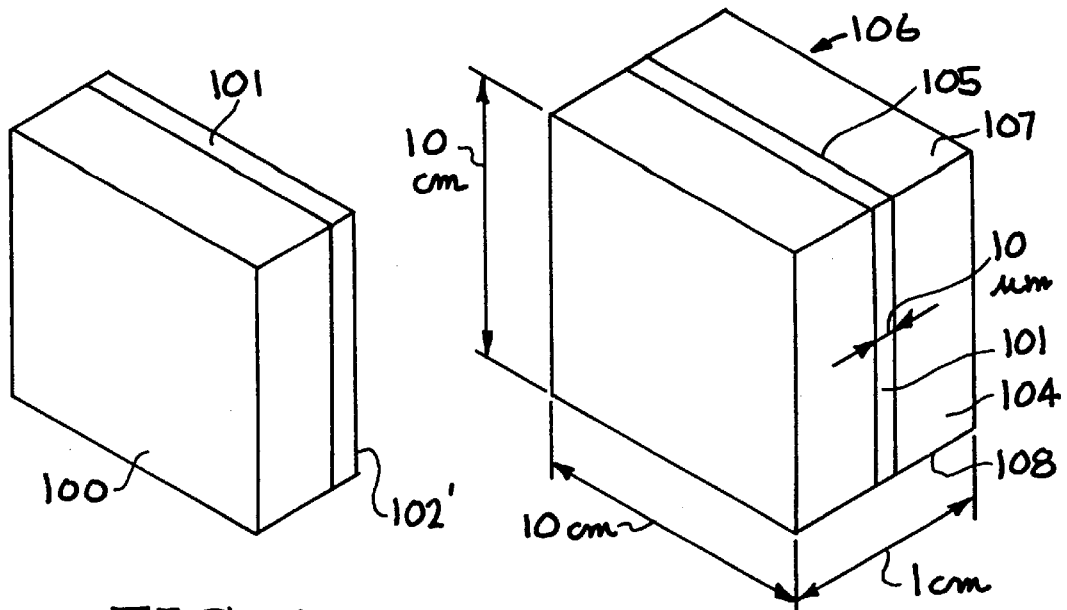
FIG. 4 is a front perspective view following FIG. 3 after reduction of the core slab.
FIG. 5 is a front perspective view following FIG. 4 after bonding a second cladding slab to the core slab to produce a planar slab waveguide construction.

Next, the exposed surface 102 (in FIG. 3) of the core slab 101 is then reduced preferably to approximately 10 microns, a thickness suitable for single mode operation for a given Δn=0.004, V=2.242. FIG. 4 shows the exposed surface 102' of the core slab 101 after reduction. Various reduction methods may be utilized, such as grinding/polishing. An alternative to polishing would be to acid etch the surface to the required thickness. In any case, FIG. 5 shows the next step of bonding a second cladding slab 104 to the exposed surface of the reduced core slab 101 at a second bond 105 using one of the bonding techniques described with respect to the first cladding slab 104. This produces a multi-layer planar construction 106 having low loss bonds. As shown in FIG. 5, the multi-layer planar construction 106 generally has miniature-scale dimensions, (except the core slab which is micro-scale) measurable in centimeters. Exemplary dimensions are shown in FIG. 5 having a height of 10 cm, a length of 10 cm and a width of 1 cm. Moreover, it is appreciated that additional core slabs and cladding slabs may be bonded in alternating slab (or layer) arrangement, with each core slab sandwiched between a pair of cladding slabs. The ratio of rare earth-doped core layers or slabs to cladding layers or slabs is n:n+1 where n is an integer ≧1.

It is notable here that in lieu of bonding the first cladding slab 100 with the core slab 101, a functionally equivalent step-indexed structure may be obtained by sputtering the doped material onto a portion of the first cladding slab 100, to create a doped core region of the first cladding slab 100. In this manner, it is possible to eliminate the first bonding/gluing step discussed above, as well as the need to reduce the surface via grinding/polishing. Additionally, the entire multi-layer planar construction 106 could alternatively be formed using fiber-pulling techniques. The fiber pulling technique allows easy initial manufacture of the desired device at a much larger scale called a preform. This large scale version can then be pulled to the desired scale and dimensions while preserving the geometric shape and relative scale of preform components. Pulling is accomplished in a draw tower which is a large tower with the preform at the top and a furnace immediately below which heats the end of the preform close to melting. The end of the preform is then stretched by a combination of gravity and tension to form a fiber of the desired dimensions. In this case, the final product is at a mesoscale between preform and fiber, which is often called "cane". The technique at this scale is called "pulling cane".

Figure 6:
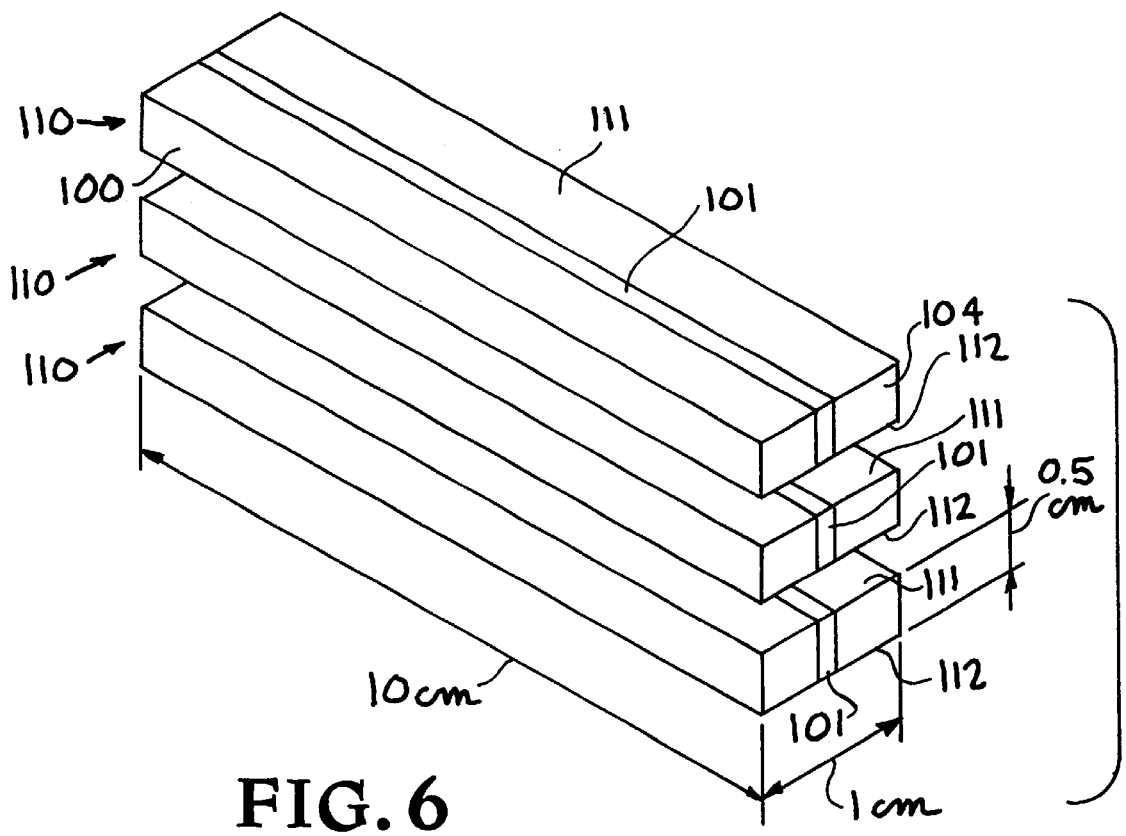
FIG. 6 is a front perspective view following FIG. 5 of the first cladding illustrating the configurations of the planar unit waveguides formed from slicing.

In FIG. 6, the multi-layer planar construction 106 is shown sliced perpendicular to the large faces of the structure 106 and into individual multi-layer planar units 110 that will each become single-mode channel waveguides. Each of the sliced units 110 is relative thin (shown as 0.5 cm) in height compared to the width and length thereof. As can be seen, the direction of the slicing produces a top surface 111 and a bottom surface 112 on each unit 110, each revealing a cross-section of the slab bonding, i.e. the sandwiched arrangement of the core slab 101 between the cladding slabs 100 and 104.

Figure 7A:
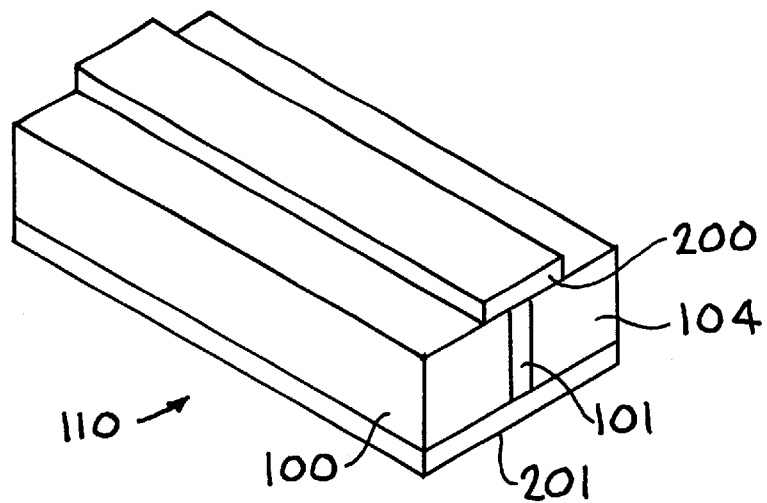
FIG. 7A is a front perspective view of a planar unit waveguide after deposition of a silver stripe and aluminum layer on the top and bottom surfaces, respectively, via photolithography.
Figure 7B:
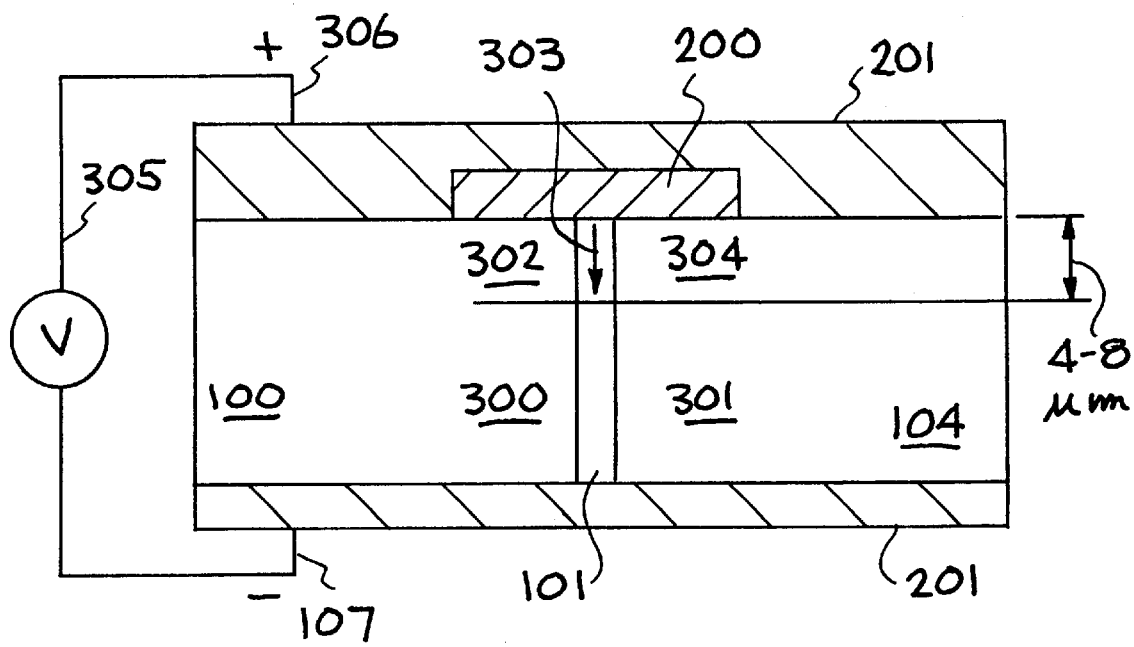
FIG. 7B is a front view of the planar unit waveguide of FIG. 7A illustrating the ion diffusion step.
Figures 13, 14:
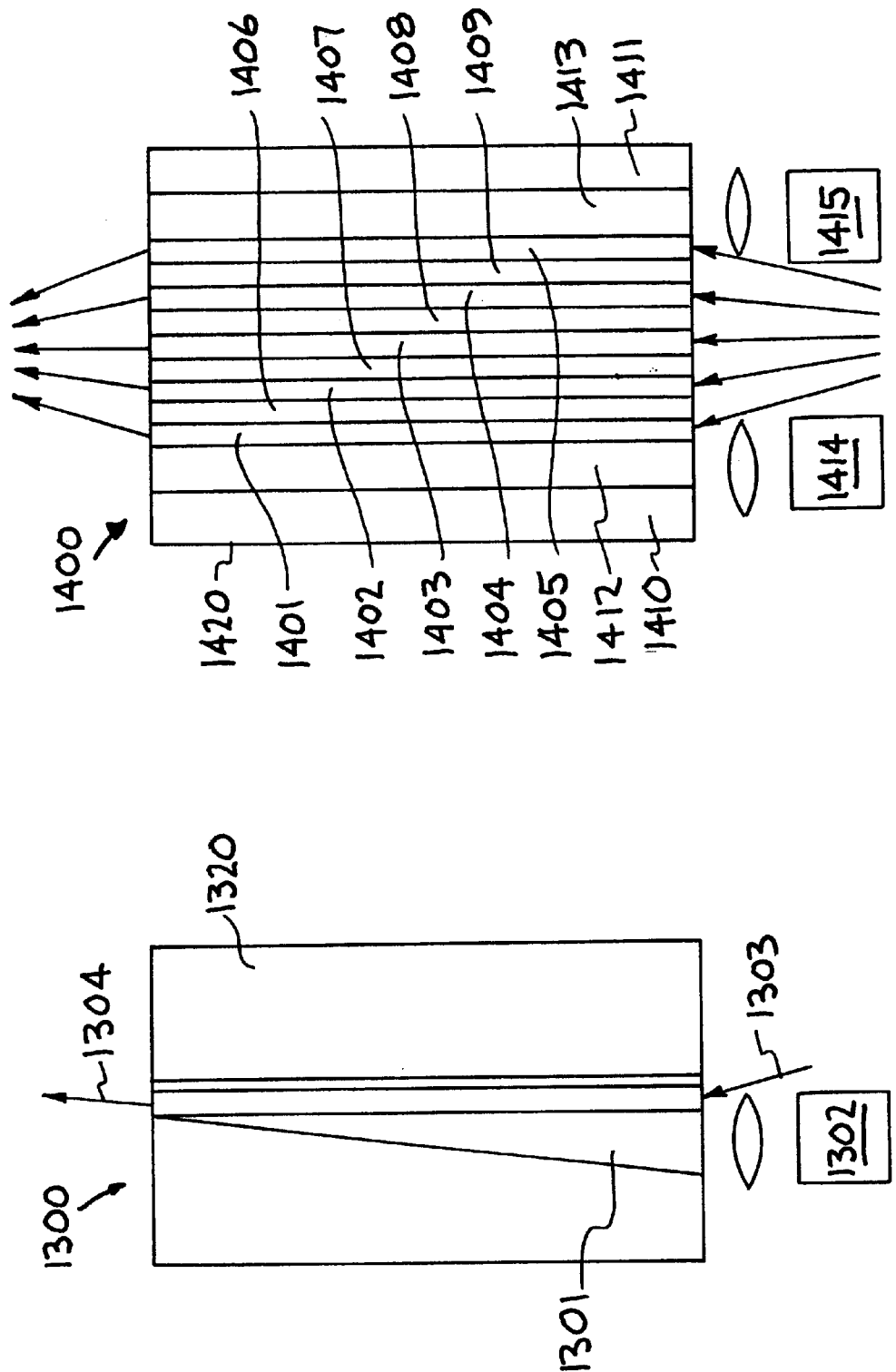
FIG. 13 is a top view of a third embodiment of a planar unit waveguide arranged in a third amplifier arrangement for optic pumping.
FIG. 14 is a top view of a fourth embodiment of a planar unit waveguide arranged in a fourth amplifier arrangement for optic pumping.

In FIG. 7A–B, one of the multi-layer planar units 110 is shown with a metallic stripe 200 formed using photolithography. Generally, the metallic stripe 200 has a metal composition capable of ion diffusing into the multi-layer planar unit 110 to raise the refractive index. Preferably, silver (Ag) is known to have suitable properties for raising the refractive index upon diffusion and is used herein as an exemplary metal of the present invention. Thus, formation of the silver stripe 200 begins by depositing a layer of silver, such as by vapor deposition, at one of the top or bottom surfaces of the multi-layer planar unit 110 to coat over the exposed core slab 101 and target portions 300, 301 in FIG. 7B. A photoresist is then applied and UV light is used to expose the resist through a photomask having a stripe width of approximately 120 microns. It is notable that the stripe width will always cover the entirety of the exposed core slab 101 (or core slabs if arranged in a multi-channel array as shown in FIGS. 14–18). Additionally, the stripe width will cover the respective target portions of each cladding slab, with each target portion comprising all or a portion of a cladding slab. For example, the target portions 300 and 301 in FIG. 7B comprise only a part of outer cladding slabs 100 and 104, respectively. In FIG. 14, however, the target portions of respective inner cladding slabs 1406–1409 comprise the entirety of each inner cladding slab. One possible variation would be to form an angled or tapered shape for the silver stripe 200 in order to produce an angled or tapered cladding region which increases diode absorption and pump efficiency (see FIGS. 13 and 15–18). The exposed resist is acid etched, removing all the silver from the multi-layer planar unit except the 120 micron silver stripe 200. Next, a layer of aluminum 201 is vapor deposited over both top and bottom faces of the waveguide 110 to serve as electrical contacts 306, 307 of an electric circuit 305.

As shown in FIG. 7B, by applying an electric field produced by the electric circuit 305 and heating the photolithographed planar unit in an oven to approximately 200–350° C., the silver stripe 200 diffuses through the top surface and into an ion diffusion region 303 of the core slab 101 and ion diffusion regions 302 and 304 of the cladding slabs 100 and 104, respectively. The application of the electric field and the heating may be separately applied to cause diffusion. It is notable that the glass slabs have a material composition capable of ion diffusion of the selected metal (e.g. Ag+ ion diffusion). For ion diffusion to occur, a modifier must be present in the glass, such as K+, Na+, or some other modifier ion which may be displaced by the metal diffusion ion. In FIG. 7B, silver ions are shown displacing sodium ions in a downward direction while the aluminum 201 remains at the surfaces. The higher polarizability of the silver ions raises the refractive index by as much as 0.04. Since this process is controlled by diffusion, the silver concentration and likewise the refractive index change follows a complementary error function profile versus distance into the waveguide. By careful control of the silver layer thickness and temperature or electric field strength, the maximum index change and diffusion depth can be chosen to restrict the waveguide to a single mode. Typical diffusion depth is shown in FIG. 7B to be approximately 4–8 microns. Applicants have observed a suitable silver layer thickness between 200–300 nm. The exact dimensions and diffusion depths can be varied to produce multimode waveguides or accommodate larger apertures, and higher power diode pump sources. It is notable that the diffusion region could also be "buried" by a second ion diffusion process which causes the silver diffusion region to diffuse further into the glass forming a waveguide below the surface of the glass. To complete the fabrication process, an acid solution is then used to remove excess silver and clean the surface of the newly formed monolithic cladding-pumped planar waveguide amplifier 120, shown in FIG. 8.

Figure 19:
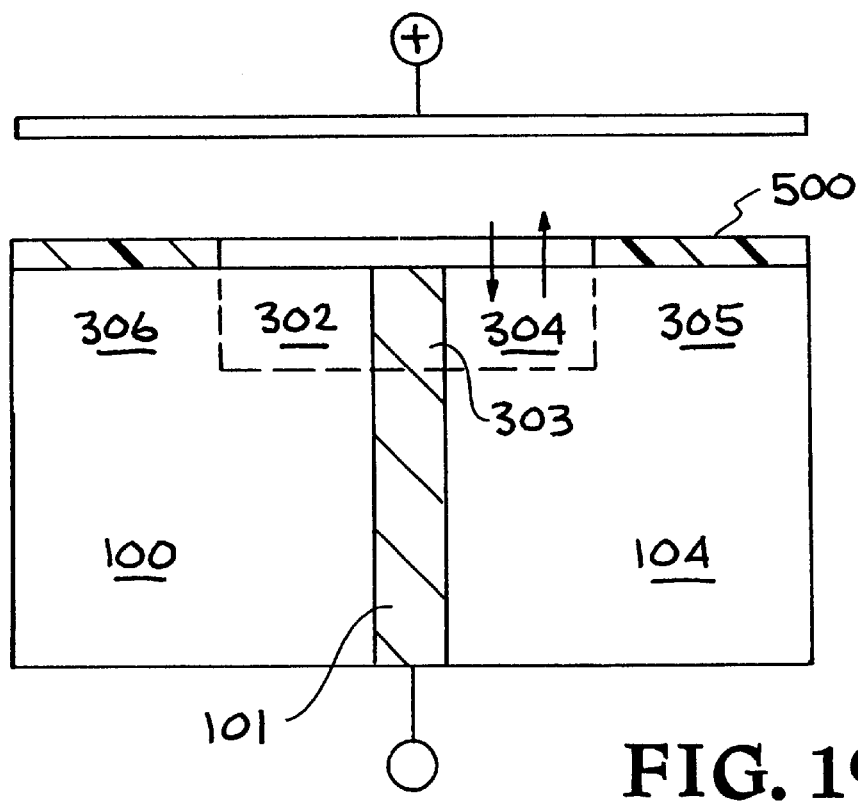
FIG. 19 is a schematic view of a diffusion process using a salt bath with enhancement by an electric field.
Figure 18:
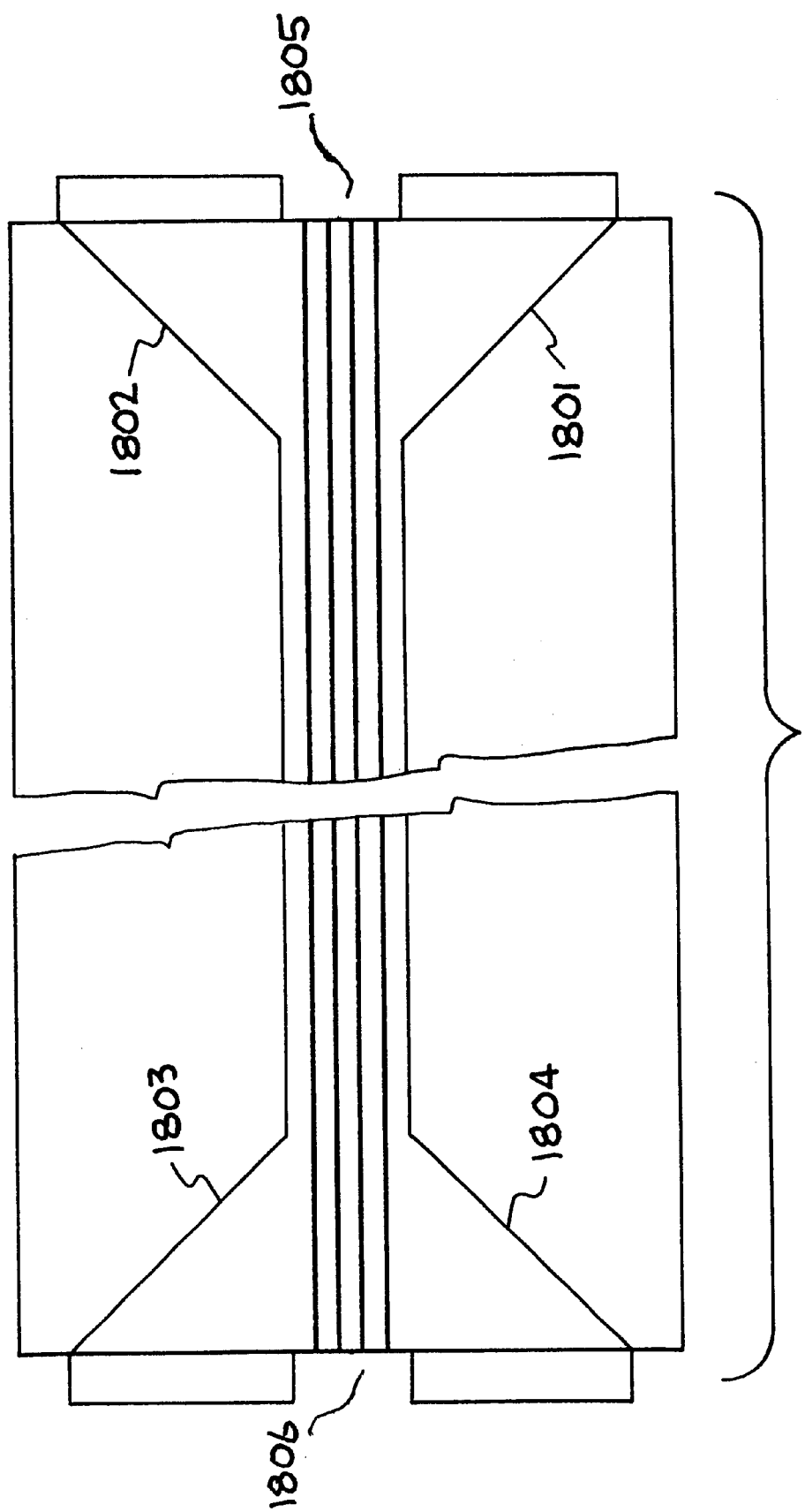
FIG. 18 is a top view of an eighth embodiment of a planar unit waveguide illustrating another arrangement and use of the ion-diffused regions of the outer cladding slabs as integrated optical couplers on opposite ends of the waveguide.

As an alternative to metal deposition and diffusion, FIG. 19 illustrates the use of a salt bath (e.g. silver nitrate, $AgNO_3$) to accomplish ion diffusion. The salt bath technique for ion diffusion creates ion exchange or diffusion conditions by placing the substrate in a bath of molten salt containing the ions to be exchanged. Then the bath and multi-layer planar unit 110 are placed in an electric field potential which facilitates the movement of ions into the substrate. It is appreciated that even with no electric field applied, diffusion will take place on both surfaces equally, but at a slower rate. In order to target only the central portion of the unit 110 comprising the core slab 101 and adjacent portions of the cladding slabs 101, 104, a photoresist 500 may be utilized. In this manner, ion-diffusion takes place only through the exposed areas of the photoresist 500 to form ion-diffused regions 302, 303, and 304 of the first cladding 100, the core slab 101, and the second cladding 104, while protecting respective non-diffused regions 305 and 306 of cladding slabs 104 and 100.

In either method of ion diffusion, the refractive index of the ion diffusion region 303 of the core slab 101 is increased over the refractive indices of all surrounding regions to form a single-mode channel waveguide, while the ion diffusion regions 302 and 304 (hereinafter "cladding regions") of the cladding slabs 100 and 104 form a second larger cladding pump waveguide amenable to cladding pumped systems. The ion-diffused regions together form an ion-diffused block laterally situated between non-diffused regions, e.g. 305 and 306, of a pair of partially-diffused cladding layers or slabs, e.g. 100 and 104. The non-diffused regions operate to define the outer boundaries of the second cladding-pump waveguide.

As noted above, possible alternatives to diffusion of silver ions (by silver deposition of salt bath) might include any ion-diffusable metal which raises the refractive index in the substrate upon ion diffusion. This includes, inter alia, alkali metals from further down the periodic table such as rubidium or cesium, as well as monovalent transitions metals such as mercury or thallium. There is also the possibility of diffusing ions with higher charge states such as divalent zinc, but these can be less mobile and can require charge compensation in the medium (For every zinc which diffuses into the medium two monovalent ions such as sodium or potassium must leave, and the zinc now occupies the space where two ions existed previously. Another possibility can be substitution for a divalent ion in the glass such as magnesium, but again the mobility is less (this makes diffusion more difficult, and could result in defect formation).

As shown in FIGS. 9 and 10, the fabricated cladding-pumped planar waveguide amplifier 120 may be coupled to and utilized with a broad area stripe diode laser 400 which pumps light 401 at 980 nm into the larger cladding region 302, 304. The high numerical aperture of the cladding region 302, 304 allows efficient coupling of the large-area, high-divergence multimode diode emission from a broad area stripe diode. As the 980 nm diode pump light 401 travels down the cladding region 302, 304 and crosses the doped core region 303, the diode light 401 is absorbed to provide amplification to an incoming signal, such as 402. Predicted gains of 20–30 dB are possible in a 5 cm long channel waveguide. It is notable that the waveguide amplifier shown in FIG. 10 illustrates the delimited regions defined subsequent to the ion diffusion step. Five regions are shown: the non ion-diffused region 305 of the second cladding slab 104, the ion-diffusion region 304 of the second cladding slab 104, the ion-diffusion region 305 of the core slab, the ion-diffusion region 302 of the first cladding slab 100, and the non-ion-diffused region 306 of the first cladding slab 100, with the regions having respective refractive indices of $n_1$, $n_2$, $n_3$, $n_4$, and $n_5$. It is appreciated that in order to effect the cladding pumping of the present invention when a signal is guided through the ion-diffusion region 303, the refractive index $n_3$ must be greater than all other indices, and both $n_2$ and $n_4$ must each be greater than $n_1$, or $n_5$. Expressed as an inequality, $n_3 > n_2, n_4 > n_1, n_5$. It is also appreciated that, while preferred, $n_2$ need not equal $n_4$, and $n_1$ need not equal $n_5$.

The cladding-pumped planar waveguide amplifier 120 of the present invention is suitable for applications such as integrated amplifiers for internet and telecommunications, and both single and multimode high-power waveguide amplifiers. While not being bound by any particular theory, it is believed that this compact cladding-pumped slab architecture offers increased functionality and performance to low and high-power waveguide lasers involving different hosts and laser ions. Moreover, lower manufacturing costs are achieved by incorporating standard lithographic techniques that naturally extend to commercial mass production. The compact slab architecture also enables the use of low cost high-power broad stripe diode pumps which can further lower costs.

Figure 12:
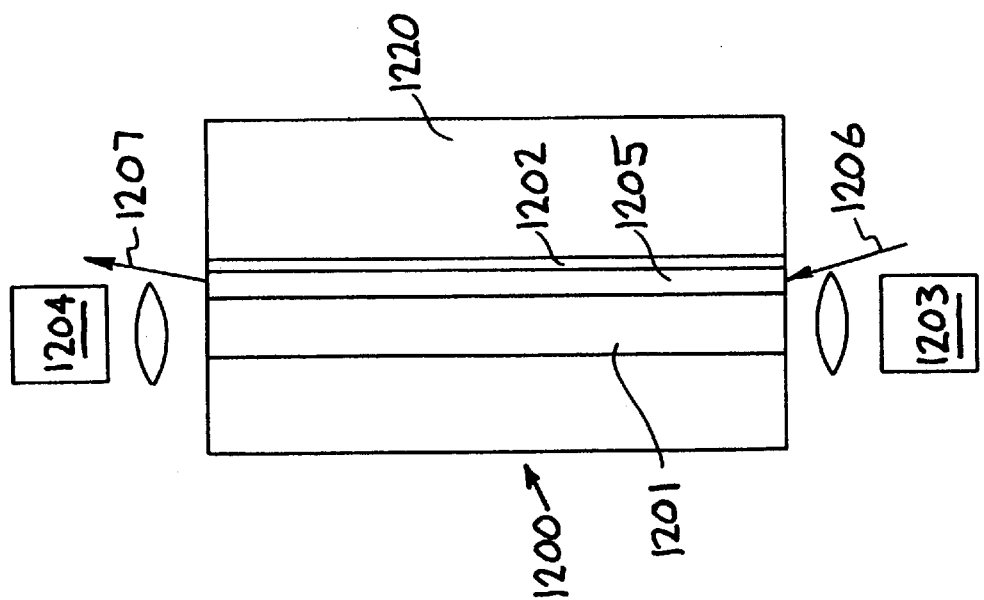
FIG. 12 is a top view of a second embodiment of a planar unit waveguide arranged in a second amplifier arrangement for optic pumping.
Figure 11:
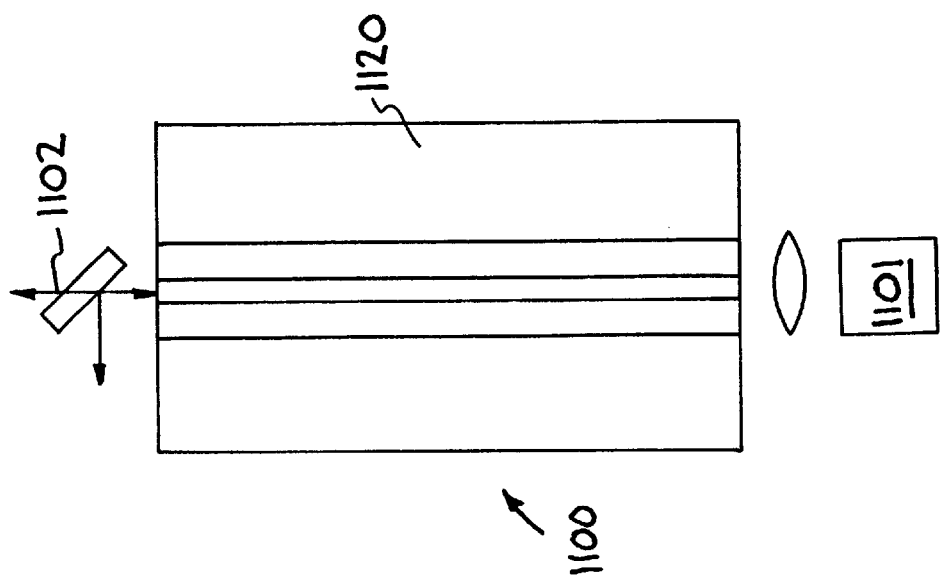
FIG. 11 is a top view of a first embodiment of a planar unit waveguide arranged in a first amplifier arrangement for optic pumping.

Exemplary waveguide amplifiers are shown in FIGS. 11–14 illustrating various configurations of the present invention. FIG. 11 shows one embodiment of an optic amplifier 1100 having a single diode pump 1101 arranged at one end of the cladding pumped waveguide amplifier 1120, with a signal input and output 1102 entering and exiting at an opposite end. FIG. 12 illustrates an asymmetric cladding arrangement of another optic amplifier embodiment 1200 having an enlarged cladding region 1201 and a smaller cladding region 1202 on the opposite side of the core slab 1205. Moreover, two broad area diode pumps 1203 and 1204 are provided at opposite ends of the cladding pumped waveguide amplifier 1220, with a signal entering the waveguide amplifier 1220 at one end indicated at arrow 1206, and exiting at the opposite end indicated at arrow 1207. FIG. 13 illustrates another asymmetric cladding region arrangement of an optic amplifier 1300 with one of the cladding regions 1301 having an angled shape to effect more efficient absorption as discussed previously. In this embodiment, a diode pump 1302 is coupled to a wide end of the angled cladding region 1301, and a signal enters at arrow 1303 and exits at arrow 1304. FIG. 14 illustrates an optic amplifier 1400 having an array of core waveguides 1401–1405 sandwiched between internal cladding slabs 1406–1409 and a pair of outer cladding slabs 1410 and 1411 in a monolithic construction formed according to the process of the present invention. The core waveguides and the cladding slabs are arranged in alternating slab (or layer) arrangement. The core waveguides 1401–1405 form separate channels for guiding multiple signals through the planar waveguide amplifier 1420. In this configuration the two diode pumps 1414 and 1415 generate light which crosses all of the core waveguides 1401–1405 to amplify the signals guided there through.

Figure 15:
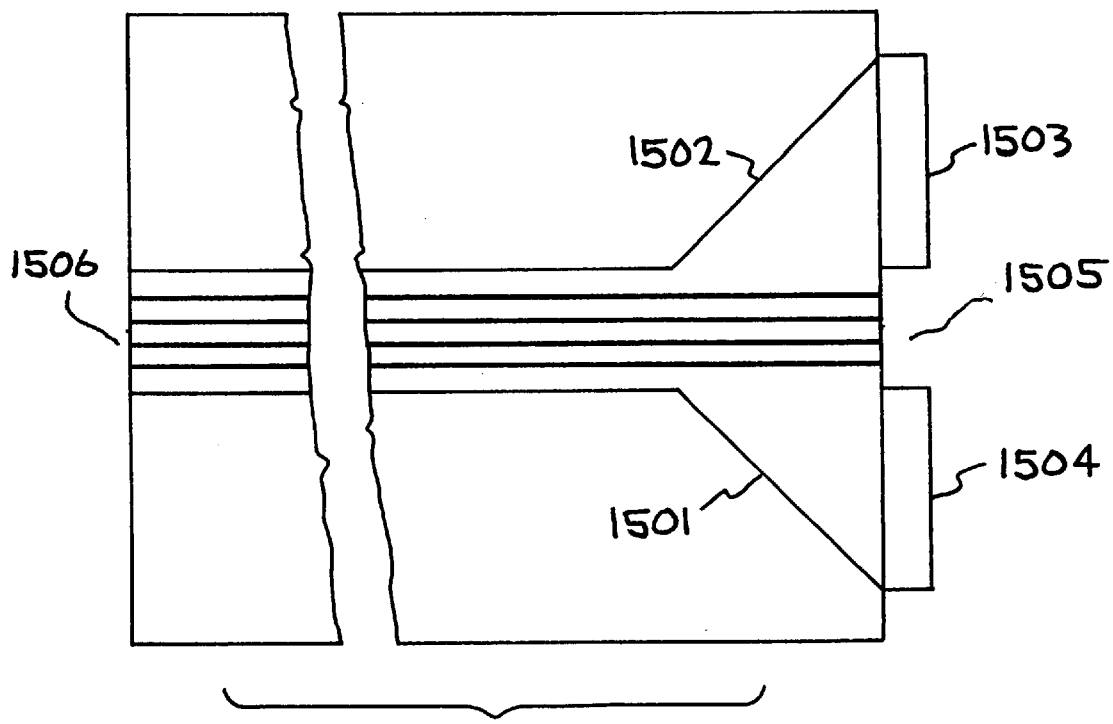
FIG. 15 is a top view of a fifth embodiment of a planar unit waveguide illustrating a first arrangement and use of the ion-diffused regions of the outer cladding slabs as an integrated optic coupler.
Figure 16:
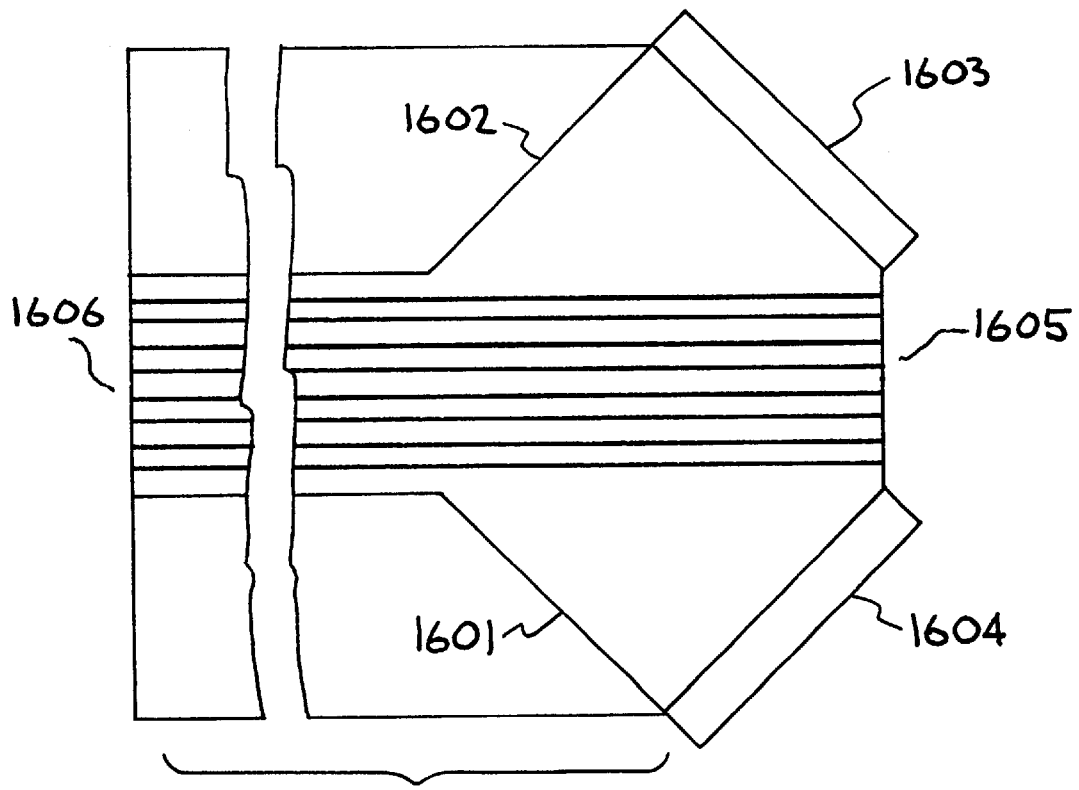
FIG. 16 is a top view of a sixth embodiment of a planar unit waveguide illustrating a second arrangement and use of the ion-diffused regions of the outer cladding slabs as an integrated optic coupler.
Figure 17:
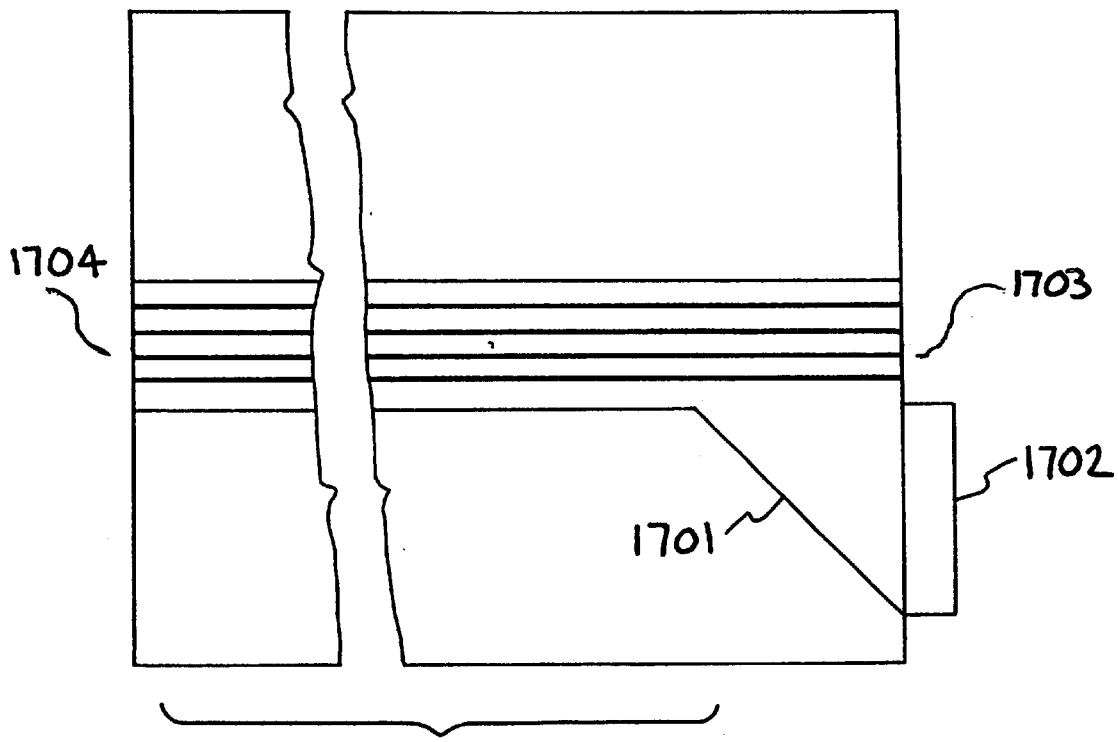
FIG. 17 is a top view of a seventh embodiment of a planar unit waveguide illustrating another arrangement and use of an ion-diffused region of one of the outer cladding slabs as an integrated optical coupler.

And in FIGS. 15–18, various planar waveguide amplifier configurations are shown with outer cladding regions (i.e.

the ion diffusion regions of the target portions of the outer cladding slabs produced by diffusion of a shaped silver stripe) having angled or tapered configurations. The tapered or otherwise convergingly angled shapes of the outer cladding regions form and operate as an integrated optic coupler extending from a narrow tapered end out to a broad input end for optimally coupling to an optic pump and increasing diode absorption and pump efficiency. In FIG. 15, outer cladding regions 1501 and 1502 have wide ends coupled to diode pumps 1503 and 1504 to amplify signals entering at an end 1505 and exiting at the opposite end 1506. In FIG. 16, outer cladding regions 1601 and 1602 have wide ends which are angled themselves to change the coupling angle and input from the diode pumps 1603 and 1604. Signals enter at end 1605 and exit at opposite end 1606. In FIG. 17, only one outer cladding region 1701 is asymmetrically tapered for coupling to a single diode 1702. Here too, the outer cladding region 1701 is tapered toward the core waveguides following signal propagation from an input end 1703 to an exit or output end 1704. And in FIG. 18, outer cladding regions 1801–1804 are tapered toward the core waveguides from opposite ends, with signals entering at end 1805 and exiting at the opposite end 1806.

The foregoing is illustrative of the present invention and is not to be construed as limiting thereof. The invention is defined by the following claims, with equivalents of the claims to be included therein.

We claim:

1. A method of fabricating a monolithic cladding-pumped optical waveguide amplifier, comprising the steps of:
   fabricating a multi-layer planar construction having n rare earth-doped core layer(s) and n+1 cladding layers in alternating layered arrangement, and top and bottom surfaces revealing a cross-section of the layers, wherein the core layer(s) has a higher refractive index than the cladding layers; and
   diffusing ions through at least one of the top and bottom surfaces into the core layer(s) and the cladding layers to form ion-diffused regions thereof having respectively increased refractive indices, the ion-diffused regions forming an ion-diffused block laterally situated between non-diffused regions of a pair of partially-diffused cladding layers, wherein the ion-diffused region(s) of the core layer(s) forms a signal waveguide (s) for carrying signals therethrough, and the ion-diffused regions of the cladding slabs together form a cladding-pump waveguide for optically pumping the signals carried through the signal waveguide(s).

2. The method as in claim 1,
wherein the multi-layer planar construction is fabricated by bonding n core slab(s) with n+1 cladding slabs in alternating layered arrangement.

3. The method as in claim 2,
wherein the multi-layer planar construction is fabricated at least in part by bonding a first cladding slab to a first core slab, reducing a thickness of the first core slab, and bonding a second cladding slab to the reduced first core slab opposite the first cladding slab.

4. The method as in claim 3,
wherein the thickness of the first core slab is reduced to about 10 µm.

5. The method as in claim 3,
wherein the thickness of the first core slab is reduced by polishing.

6. The method as in claim 3,
wherein the thickness of the first core slab is reduced by chemical etching.

7. The method as in claim 2,
wherein the core slab(s) and the cladding slabs are surface figured to about $\lambda/20$ wave flatness prior to slab bonding for minimizing loss at the bonds.

8. The method as in claim 2,
wherein a silica glue is used to effect slab bonding.

9. The method as in claim 2,
wherein a phosphate glue is used to effect slab bonding.

10. The method as in claim 2,
wherein an epoxy polymer is used to effect slab bonding.

11. The method as in claim 2,
wherein the slabs are bonded by diffusion bonding.

12. The method as in claim 1,
wherein the multi-layer planar construction is fabricated by a fiber pulling technique.

13. The method as in claim 1,
further comprising producing by metal deposition and photolithography an ion-diffusable metallic stripe on one of the top and bottom surfaces and over the core layer(s) and the cladding layers; and
wherein the step of diffusing ions comprises diffusing metallic ions from the metallic stripe into the core layers(s) and the cladding layers.

14. The method as in claim 13,
wherein the ion-diffusable metal is silver.

15. The method as in claim 13,
wherein the metallic ions are diffused by applying an electric field between the top and bottom surfaces.

16. The method as in claim 15,
wherein the metallic ion diffusion is enhanced by heating the multi-layer planar construction.

17. The method as in claim 16,
further comprising controlling at least one parameter of metallic stripe thickness, heating temperature, and electric field strength, to select maximum refractive index change and diffusion depth.

18. The method as in claim 15,
further comprising depositing aluminum over the metallic stripe to provide electrical contact during application of the electric field, and subsequently removing the aluminum and excess metallic stripe after diffusion.

19. The method as in claim 1,
wherein the step of diffusing ions comprises placing the multi-layer planar construction in a salt bath.

20. The method as in claim 19,
wherein the step of diffusing ions further comprises applying an electric field between the top and bottom surfaces to enhance the diffusion rate and depth.

21. The method as in claim 1,
further comprising slicing the multi-layer planar construction into at least two multi-layer planar units each having top and bottom surfaces revealing a cross-section of the layers; and
wherein the diffusion of ions occurs through at least one of the top and bottom surfaces of each multi-layer planar unit.

22. The method as in claim 1,
wherein the rare earth-doped core layer(s) is doped with erbium.

23. A monolithic cladding-pumped optical waveguide amplifier produced according to the method of claim 1.

24. The optical waveguide amplifier as in claim 23,
wherein at least one of the ion-diffusion regions of the partially-diffused cladding layers is shaped to form an integrated optic coupler extending from a narrow tapered end out to a broad input end for optimally coupling to an optic pump.

25. A method of fabricating a monolithic cladding-pumped optical waveguide amplifier, comprising the steps of:

bonding n rare earth-doped core slab(s) with n+1 cladding slabs in alternating layered arrangement to produce a multi-layer planar construction, wherein the core slab(s) has a refractive index greater than the cladding slabs;

slicing the multi-layer planar construction into at least two multi-layer planar units each having top and bottom surfaces revealing a cross-section of the slab bonding;

on each multi-layer planar unit,
producing by metal deposition and photolithography an ion-diffusable metallic stripe on one of the top and bottom surfaces and over the core slab(s) and the cladding slabs; and diffusing ions from the metallic stripe into the core slab(s) and the cladding slabs to form ion-diffused regions of the core slab(s) and the cladding slabs having respectively increased refractive indices, the ion-diffused regions forming an ion-diffused block laterally situated between non-diffused regions of a pair of partially-diffused cladding slabs, wherein the ion-diffused region of the core slab forms a signal waveguide for carrying signals therethrough, and the ion-diffused regions of the cladding slabs together form a cladding-pump waveguide for optically pumping the signals carried through the signal waveguide.

26. The method as in claim 25,
wherein the multi-layer planar construction is produced at least in part by bonding a first cladding slab to a first core slab, reducing a thickness of the first core slab, and bonding a second cladding slab to the reduced first core slab opposite the first cladding slab.

27. The method as in claim 26,
wherein the thickness of the first core slab is reduced to about 10 µm.

28. The method as in claim 26,
wherein the thickness of the first core slab is reduced by polishing.

29. The method as in claim 26,
wherein the thickness of the first core slab is reduced by chemical etching.

30. The method as in claim 25,
wherein the core slab(s) and the cladding slabs are surface figured to about $\lambda/20$ wave flatness prior to slab bonding for minimizing loss at the bonds.

31. The method as in claim 25,
wherein a silica glue is used to effect slab bonding.

32. The method as in claim 25,
wherein a phosphate glue is used to effect slab bonding.

33. The method as in claim 25,
wherein an epoxy polymer is used to effect slab bonding.

34. The method as in claim 25,
wherein the slabs are bonded by diffusion bonding.

35. The method as in claim 25,
wherein the ion-diffusable metal is silver.

36. The method as in claim 25,
wherein the metallic ions are diffused by applying an electric field between the top and bottom surfaces.

37. The method as in claim 36,
wherein the metallic ion diffusion is enhanced by heating the multi-layer planar construction.

38. The method as in claim 37,
further comprising controlling at least one parameter of metallic stripe thickness, heating temperature, and electric field strength, to select maximum refractive index change and diffusion depth.

39. The method as in claim 36,
further comprising depositing aluminum over the metallic stripe to provide electrical contact during application of the electric field, and subsequently removing the aluminum and excess metallic stripe after diffusion.

40. The method as in claim 25,
wherein the core slab(s) is doped with erbium.

41. A monolithic cladding-pumped optical waveguide amplifier produced according to the method of claim 25.

42. The optical waveguide amplifier as in claim 41,
wherein at least one of the ion-diffusion regions of the partially-diffused cladding slabs is shaped to form an integrated optic coupler extending from a narrow tapered end out to a broad input end for optimally coupling to an optic pump.

43. A method of fabricating a monolithic cladding-pumped optic waveguide amplifier from a multi-layer planar substrate, said multi-layer planar substrate having n rare earth-doped core layer(s) and n+1 cladding layers in alternating layer arrangement, and top and bottom surfaces revealing a cross-section of the layers, wherein the core layer(s) has a higher refractive index than the cladding layers, said method comprising the steps of:

diffusing ions through at least one of the top and bottom surfaces into the core layer(s) and the cladding layers to form ion-diffused regions thereof having respectively increased refractive indices, the ion-diffused regions forming an ion-diffused block laterally situated between non-diffused regions of a pair of partially-diffused cladding layers, wherein the ion-diffused region(s) of the core layer(s) forms a signal waveguide(s) for carrying signals therethrough, and the ion-diffused regions of the cladding slabs together form a cladding-pump waveguide for optically pumping the signals carried through the signal waveguide(s).

44. The method as in claim 43,
further comprising producing by metal deposition and photolithography an ion-diffusable metallic stripe on one of the top and bottom surfaces and over the core layer(s) and the cladding layers; and
wherein the step of diffusing ions comprises diffusing metallic ions from the metallic stripe into the core layers(s) and the cladding layers.

45. The method as in claim 44,
wherein the ion-diffusable metal is silver.

46. The method as in claim 44,
wherein the metallic ions are diffused by applying an electric field between the top and bottom surfaces.

47. The method as in claim 46,
wherein the metallic ion diffusion is enhanced by heating the multi-layer planar construction.

48. The method as in claim 47,
further comprising controlling at least one parameter of metallic stripe thickness, heating temperature, and electric field strength, to select maximum refractive index change and diffusion depth.

49. The method as in claim 46,
further comprising depositing aluminum over the metallic stripe to provide electrical contact during application of the electric field, and subsequently removing the aluminum and excess metallic stripe after diffusion.

50. The method as in claim 43,
wherein the step of diffusing ions comprises placing the multi-layer planar construction in a salt bath.

51. The method as in claim 50,
wherein the step of diffusing ions further comprises applying an electric field between the top and bottom surfaces to enhance the diffusion rate and depth.

52. The method as in claim 43,
further comprising slicing the multi-layer planar construction into at least two multi-layer planar units each having top and bottom surfaces revealing a cross-section of the layers; and
wherein the diffusion of ions occurs through at least one of the top and bottom surfaces of each multi-layer planar unit.

53. The method as in claim 43,
wherein the rare earth-doped core layer(s) is doped with erbium.

54. A monolithic cladding-pumped optical waveguide amplifier produced according to the method of claim 43.

55. The optical waveguide amplifier as in claim 54,
wherein at least one of the ion-diffusion regions of the partially-diffused cladding layers is shaped to form an integrated optic coupler extending from a narrow tapered end out to a broad input end for optimally coupling to an optic pump.

* * * * *